(12) United States Patent
Miska

(10) Patent No.: US 6,943,288 B1
(45) Date of Patent: Sep. 13, 2005

(54) EMI FOIL LAMINATE GASKET

(75) Inventor: Stanley R. Miska, Pittsford, NY (US)

(73) Assignee: Schlegel Systems, Inc., Rochester, NY (US)

( * ) Notice: Subject to any disclaimer, the term of this patent is extended or adjusted under 35 U.S.C. 154(b) by 0 days.

(21) Appl. No.: 10/860,985

(22) Filed: Jun. 4, 2004

(51) Int. Cl.$^7$ ............................. H05K 5/00; H05K 9/00
(52) U.S. Cl. ................. 174/35 GC; 29/846; 277/920
(58) Field of Search ................ 174/35 GC, 35 R, 174/50; 29/831, 846; 277/920; 361/816, 361/818

(56) References Cited

U.S. PATENT DOCUMENTS

| | | | |
|---|---|---|---|
| 3,555,168 A | 1/1971 | Frykberg | |
| 3,969,572 A | 7/1976 | Rostek | |
| 4,670,347 A * | 6/1987 | Lasik et al. ................. | 428/458 |
| 4,684,762 A | 8/1987 | Gladfelter | |
| 4,857,668 A | 8/1989 | Buonanno | |
| 4,900,618 A | 2/1990 | O'Connor et al. | |
| 4,916,016 A | 4/1990 | Bristowe et al. | |
| 4,965,408 A * | 10/1990 | Chapman et al. ...... | 174/35 MS |
| 5,028,739 A * | 7/1991 | Keyser et al. ......... | 174/35 GC |
| 5,045,635 A | 9/1991 | Kaplo et al. | |
| 5,105,056 A * | 4/1992 | Hoge et al. ............ | 174/35 GC |
| 5,202,536 A * | 4/1993 | Buonanno ............... | 174/35 GC |
| 5,473,111 A | 12/1995 | Hattori et al. | |
| 5,524,908 A | 6/1996 | Reis | |
| 5,597,979 A | 1/1997 | Courtney et al. | |
| 5,656,795 A | 8/1997 | Miska | |
| 5,804,762 A | 9/1998 | Jones et al. | |
| 6,207,266 B1 | 3/2001 | Kanbara et al. | |
| 6,248,401 B1 | 6/2001 | Chiang et al. | |
| 6,252,159 B1 * | 6/2001 | Anagnos ................. | 174/35 MS |
| 6,294,729 B1 | 9/2001 | Kaplo | |
| 6,410,137 B1 | 6/2002 | Bunyan | |
| 6,465,731 B1 | 10/2002 | Miska | |
| 6,541,698 B2 | 4/2003 | Miska | |
| 6,667,435 B1 * | 12/2003 | French et al. .......... | 174/35 GC |
| 6,720,494 B1 * | 4/2004 | Norte et al. ........... | 174/35 GC |
| 6,768,052 B2 * | 7/2004 | Yamada et al. ........... | 174/35 R |
| 6,784,363 B2 * | 8/2004 | Jones ..................... | 174/35 GC |
| 6,822,880 B2 * | 11/2004 | Kovacs et al. .............. | 361/818 |
| 2002/0050373 A1 | 5/2002 | Kaplo | |
| 2002/0129494 A1 | 9/2002 | Miska | |
| 2002/0129953 A1 | 9/2002 | Miska | |
| 2003/0051891 A1 | 3/2003 | Rapp et al. | |
| 2003/0066672 A1 | 4/2003 | Watchko et al. | |
| 2003/0121688 A1 | 7/2003 | Thompson et al. | |
| 2003/0227762 A1 | 12/2003 | Schnabel | |

* cited by examiner

*Primary Examiner*—Dean A. Reichard
*Assistant Examiner*—Adolfo Nino
(74) *Attorney, Agent, or Firm*—Stephen B. Salai, Esq.; Brian B. Shaw, Esq.; Harter, Secrest & Emery LLP

(57) ABSTRACT

A conductive electromagnetic interference (EMI) shielding gasket having a compressible non-conductive core enwrapped with a conductive sheath. The sheath is a laminate formed by laminating a conductive metal foil at least 0.2 mils thick to a flexible non-conductive substrate, preferably a non porous polyester film.

16 Claims, 2 Drawing Sheets

EMI FOIL LAMINATE GASKET

CROSS-REFERENCE TO RELATED APPLICATIONS

None

STATEMENT REGARDING FEDERALLY SPONSORED RESEARCH OR DEVELOPMENT

Not appliable

REFERENCE TO A "SEQUENCE LISTING"

Not applicable.

BACKGROUND OF THE INVENTION

1. Field of the Invention

The present invention relates to a conductive gasket as may be used in applications requiring electromagnetic interference (EMI) shielding. More particularly, the present invention relates to an EMI gasket that has a relatively thick metal conductive layer and a flexibility that resists cracking when bent.

2. Description of Related Art

Many modern electronic devices emit or are sensitive to electromagnetic interference (EMI) at high frequencies. Electromagnetic interference is understood to mean undesired conducted or radiated electrical disturbances from an electric or electronic apparatus, including transients, which can interfere with the operation of other electrical or electronic apparatus. Such disturbances can occur anywhere in the electromagnetic spectrum. Radio frequency interference (RFI) refers to disturbances in the radio frequency portion of the spectrum but often is used interchangeably with electromagnetic interference. Both electromagnetic and radio frequency interference are referred to hereafter as EMI.

A shield usually is inserted between a source of EMI and a desired area of protection. A shield is defined as a metallic or otherwise conductive configuration, which has the capability of absorbing and/or reflecting EMI and reducing the energy levels of the EMI. Such shields normally take the form of a conductive housing, which is electrically grounded. A shield may be provided to prevent EMI radiating from a source or to prevent EMI (generated randomly or by design) from reaching a target, or both.

Most such housings are provided with access panels, hatches, doors or other removable closure. Any gap between the metal surface confronting, abutting or mating with the closure affords an opportunity for the passage of EMI. Gaps also interfere with electrical currents running along the surfaces of the cabinets from EMI energy, which is absorbed and is being conducted to ground. The gaps reduce the efficiency of the ground conduction path and may even result in the shield becoming a secondary source of EMI leakage from gaps acting as slot antennae. Accordingly, it is common to use a conductive seal or gasket between such surfaces to block the passage of EMI.

Various configurations of gaskets have been developed to close the gaps between components of the shield. These gaskets establish as continuous a conductive path as possible across any gap that may exist, for example, between cabinet components. A common gasket employs a flexible core enclosed in a woven fabric made at least in part with conductive fibers. Examples of such fabrics are disclosed in U.S. Pat. No. 4,684,762.

Another common gasket construction as disclosed, for example, in U.S. Pat. Nos. 4,857,668, and 5,597,979 has a flexible core enclosed in an electrically conductive sheath formed of a non-conducting woven or non-woven fabric. The fabric is rendered conductive by an electroless plating process wherein the fabric is dipped in a silver nitrate bath to impregnate the fabric with silver. In an alternative process, the conductive material including silver or copper may be applied by sputter deposition. After impregnation or coating with silver, the fabric is coated with a non-corrosive material to prevent the oxidation of the silver surface. Suitable coating materials applied either by electroplating or sputter deposition include a pure metal such a nickel or tin, a metal alloy such as Inconel® or Nichrome® or a carbon compound.

In still another type of gasket, the conductive sheath as shown in U.S. Pat. No. 6,541,698 comprises a polymeric film that is rendered conductive by the vapor deposition of a conductive metal onto a surface of the film.

There are several criteria used to measure the performance of an EMI gasket. For example, its electrical performance is measured by the surface resistivity in ohms/square of the gasket at a given compressive load. A low resistivity is desired as this means that the surface conductivity of the gasket is high. EMI shielding performance as measured in decibels over a range of frequencies ranging form 20 MHz to 18 GHz wherein a constant decibel level over this range is preferred. These performance criteria are dependent, in part by the thickness of the conductive metal component of the gasket sheath; a thicker layer providing better performance than a thinner layer.

A fabric or film rendered conductive as described above represents a material of choice because its flexibility allows the material to be wrapped around a compressible core. A disadvantage of such materials is that they are costly to manufacture and there are practical limits to the thickness of a metal layer that can be deposited either by vapor deposition or by electroless plating. For example the practical limit for metal thickness using electroless deposition is about 0.03 mils and for vapor deposition about 0.02 mils.

Another drawback of fabrics coated with metal by electroless or vapor deposition is that they tend to be porous. It is believed that this porosity may allow high frequencies to pass through the porous fabric. While porosity is not an issue with a metal-coated film, the issue of limits as to the thickness of the metal coating that is practicable with electroless or vapor deposition remains.

An alternative to such a fabric is to use a metal foil. A metal foil is less costly than a metallized fabric and foils are generally thicker. However metal foils per se are not compressible and therefore a metal foil gasket is not generally used between mating parts. Nor are metal foils generally used for wrapping around a compressible core because a foil is relatively stiffer than a metallized fabric or film and may crack if sharply bent. Consequently, the foil is subject to cracking or wrinkling when a gasket made with foil is repeatedly compressed and decompressed. In addition, most foils will corrode and are not galvanically compatible with other metals so that the use of foils, as a gasket sheathing material, is limited.

U.S. Pat. No. 3,555,168 discloses an RF shielding gasket comprising a metal foil bonded directly to a compressively resilient foam backing. However the foil merely lies along one side of the foam backing and does not wrapped around the backing to completely enclose it.

While metallized fabrics/films and metal foils have received wide acceptance in the industry, there still is a need for improvement of the materials used to sheath a compressible core of the gasket. In this respect gasket sheathing materials that have a relatively thick metal layer while being relatively flexible and inexpensive to manufacture would satisfy both performance and cost considerations.

BRIEF SUMMARY OF THE INVENTION

In the present invention, conductive sheath issues of both flexibility and the thickness-of-metal are addressed by providing a sheath having a laminated structure. The laminate includes a substrate composed of a woven or non-woven fabric, or polymeric film and preferably a nonporous film. Laminated to this substrate is a copper or aluminum foil. The substrate may range in thickness from 0.25 to 8 mils whereas the foil generally has a thickness of about 0.2 mils or 10 times the thickness of a metal layer produced by electroless or vapor deposition.

Both the metal foil and the substrate typically are provided in relatively long continuous lengths (for example, 5000 yards) so a lamination process to join these two components can benefit from the efficiencies of continuous operation. The lamination can be achieved by use of an appropriate adhesive to adhere the metal foil to the substrate. For example, the adhesive may include, but is not limited to ethyl acrylate acetate (EAA), low-density polyethylene (LDPE), a hot melt adhesive or a solvent-based adhesive.

After the lamination is formed, it may be provided with non-corrosive and/or abrasion resistant coating. For example a vapor deposition process may be used to apply a thin coating (200 Å) of Monel® over the exposed surface of the metal foil. Other coating methods and materials include solvent coating acrylic, polyvinylidene (PVD) NiChrome® or Inconel®.

Accordingly, the present invention may be characterized in one aspect thereof by a conductive electromagnetic interference (EMI) shielding gasket including a compressible core and a conductive laminate on a least part of the core, the laminate portion of the gasket comprising:
  a) a substrate being one of a nonwoven film and a polymeric film;
  b) an adhesive layer on a surface of the substrate;
  c) a metal foil at least 0.2 mils thick bonded to the substrate by the adhesive directly contacting a reverse surface of the metal foil; and
  d) a vapor deposited abrasion and corrosion resistant coating on the obverse surface of the metal foil.

In its method aspect the present invention comprises
  a) a) forming a sheath by laminating a metal foil at least 0.2 inches thick to a substrate comprising one of a woven fabric, a non woven fabric and a polymeric film, the sheath including a corrosion resistant coating on the exposed surface of the metal foil; and
  b) applying the sheath to at least one surface of a compressible core.

BRIEF DESCRIPTION OF THE SEVERAL VIEWS OF THE DRAWING(S)

DETAILED DESCRIPTION OF THE INVENTION

Figure 1:
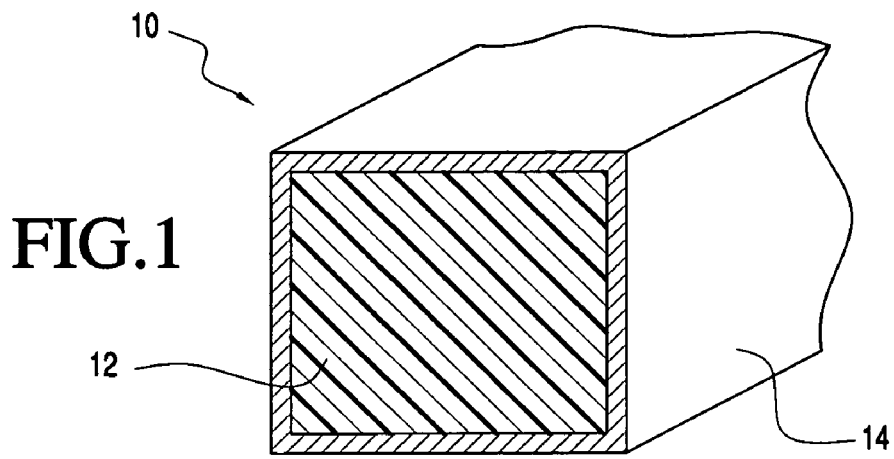
FIG. 1 is a cross sectional view of an EMI gasket including a lamination according to the present invention.

Referring to the drawings, FIG. 1 shows a conductive gasket of the present invention generally indicated at 10. The gasket comprises a foam core 12 which is resilient and compliant over a range of temperatures and which preferably exhibits good compression set characteristics such that the material will "spring back" after repeated compression and decompression and even after long periods of compression. For example, a suitable material for the core 12 is an open-celled polyether polyurethane foam in a high-resiliency formula. In a preferred embodiment the compressive set of the foam is 1% at ambient temperature and less than 5% at 70° C. (158° F. when compresses 50% for 22 hours.

Surrounding the core 12 is a conductive sheath 14. It should be appreciated that the shape of the cross section of the gasket as shown is for purposes of illustration only. Also, the thicknesses of the various components are not to scale but are shown greatly enlarged for clarity. For example the gasket itself may range from 0.02 to 1.0 inches thick with the sheath 14 being no more than about 0.008 inches thick.

Figure 2:
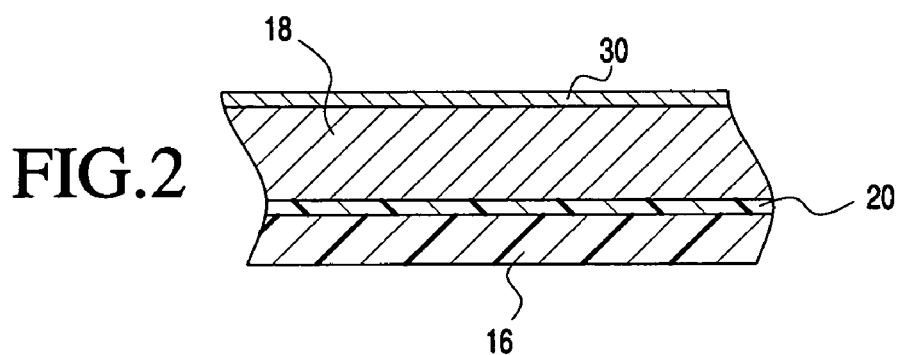
FIG. 2 is a cross sectional view on an enlarged scale of a laminate according to the present invention.

The sheath 14 is shown in more detail in FIG. 2. The sheath is a laminate comprising a substrate 16 that may range in thickness from 0.25 mils to 8 mils. The substrate may be a woven or non-woven fabric and preferably is a nonporous polymeric film such as nylon or the like. In a preferred embodiment the substrate is a polyester film.

Laminated to a surface of the substrate is a conductive metal foil 18 such as aluminum or copper. A metal foil generally is on the order of 0.2 mils thick or about ten times the thickness of a conventional vapor or electroless deposited layer metal layer. Both the substrate material and the metal foil are conventionally provided in rolls containing up to about 5,000 yards of material. This allows a relatively continuous lamination process as set out further hereinbelow.

As shown in FIG. 2, the metal foil 18 is adhered to the substrate by an adhesive layer 20. The adhesive may be an ethyl acrylic acetate (EAA), low-density polyethylene (LDPE) a hot melt adhesive or a solvent-based adhesive.

Figure 3:
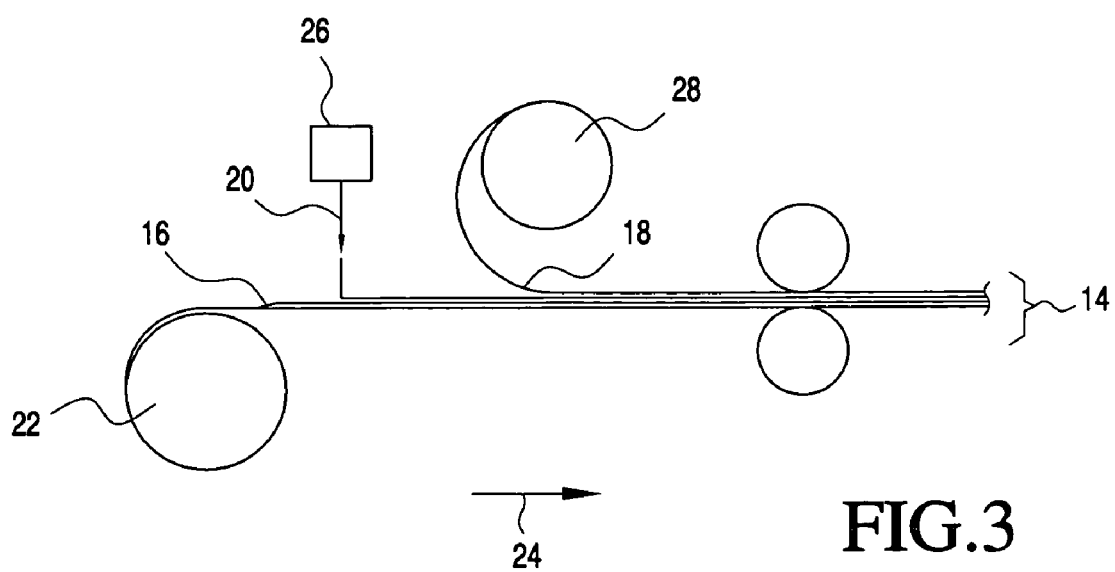
FIG. 3 is a schematic representation of the steps as may be employed in the manufacture of a gasket according to the present invention.

In view of the long lengths of the foil and substrate, the lamination process may be accomplished in a relatively continuous process as shown for example in FIG. 3. FIG. 3 shows a roll 22 of the substrate material 16 being unrolled in the direction of arrow 24. An applicator 26 applies a film of the adhesive 20 onto the substrate. Downstream of the applicator 26, the metal foil 18 is unrolled from a roll 28 and is pressed against the adhesive to form the laminate 14.

The lamination process as shown in FIG. 3 is merely illustrative. In this respect where the substrate is a polymeric film, the lamination may be formed by the continuous extrusion of the adhesive and/or substrate material onto the metal foil. Whatever the lamination process, the end result is a flexible laminate wherein cracking of the relatively thick metal foil on bending is resisted by the flexibility of the substrate.

After the lamination is formed, a corrosion resistant layer 30 (FIG. 2) may be applied to the exposed surface of the metal foil. For example a 200 Å coating of Monel® can be applied by a physical vapor deposition (PVD) process to a copper foil to improve corrosion resistance. Other methods and materials to enhance corrosion resistance include solvent coating of an acrylic or PVD coating NiChrome® or Inconel®. The lamination then is used to form the conductive gasket of FIG. 1 by any conventional process, such as wrapping about the foam or other compressible core material.

The gasket of the present invention including a metal foil laminated to a flexible substrate was found to have several advantages over comparable gaskets of the prior art comprising vapor or electroless deposited metallic layers on a woven or nonwoven flexible substrate. These advantages are demonstrated by the comparative results of three types of EMI gasket as set out in Table I below.

The first gasket, Sample A comprises a conventional polyester woven substrate plated by an electroless process first with a layer of copper and then a layer of nickel over coated with an acrylic-based coating for improved galvanic compatibility with other materials.

The second gasket, Sample B comprises a conventional polyester rip-stop fabric plated with copper and then nickel and over coated with an acrylic-based coating. In both of these comparative gaskets, the metallized fabric had an overall metal layer thickness of about 0.02 mils and the substrate was disposed about a core comprising an open-celled polyurethane foam.

The third gasket, identified as Sample C, comprises a gasket according to the present invention. This gasket comprises a non-woven polyester substrate wrapped about an open-celled polyurethane foam. Laminated to a surface of the substrate is an aluminum foil about 0.285 mils thick.

The gaskets are each subjected to standard tests to determine the surface resistivity of the gasket under load, contact resistance and shielding effectiveness over a range of frequencies.

The results of these tests are shown in Table I below.

TABLE 1

|  | Sample A | Sample B | Sample C |
|---|---|---|---|
| Surface Resistivity (Ohms/square) | 0.02 or more | 0.066 or more | 0.003 |
| Contact Resistance (Max) Ohms-inch @ 1 kg load | <1.0 | 0.11 | <0.11 |
| Average Shielding Effectiveness From 20 MHz to 10 GHz | 97.4 dB | 96 dB | 96.7 dB |

Table I shows that the surface resistivity of the Sample C gasket (an embodiment of the invention) is an order of magnitude less than either of the comparative gaskets. This is attributed in part to the thickness of the metal foil laminate of the Sample C gasket being greater than the thickness of the vapor or electroless deposited metal plating of the comparative gaskets. A lower surface resistivity means that the surface conductivity of the inventive gasket is appreciably higher than either of the conventional gaskets.

Table I also shows that the contact resistance of the Sample C gasket is less than either of the comparative gaskets. It is believed that a contributing factor to this is the relative smoothness of the exposed surface of the metal foil. In this respect the surface of a metal foil is relatively smooth and smoother than the surface of a metal layer deposited by vapor or electroless deposition of metal onto a woven or non-woven fabric surface. It is believed that the smoother surface of the Sample C gasket provides a greater contact area with abutting metal surfaces so that the Sample C gasket provides a more conductive path with those abutting or mating surfaces.

Figure 4:
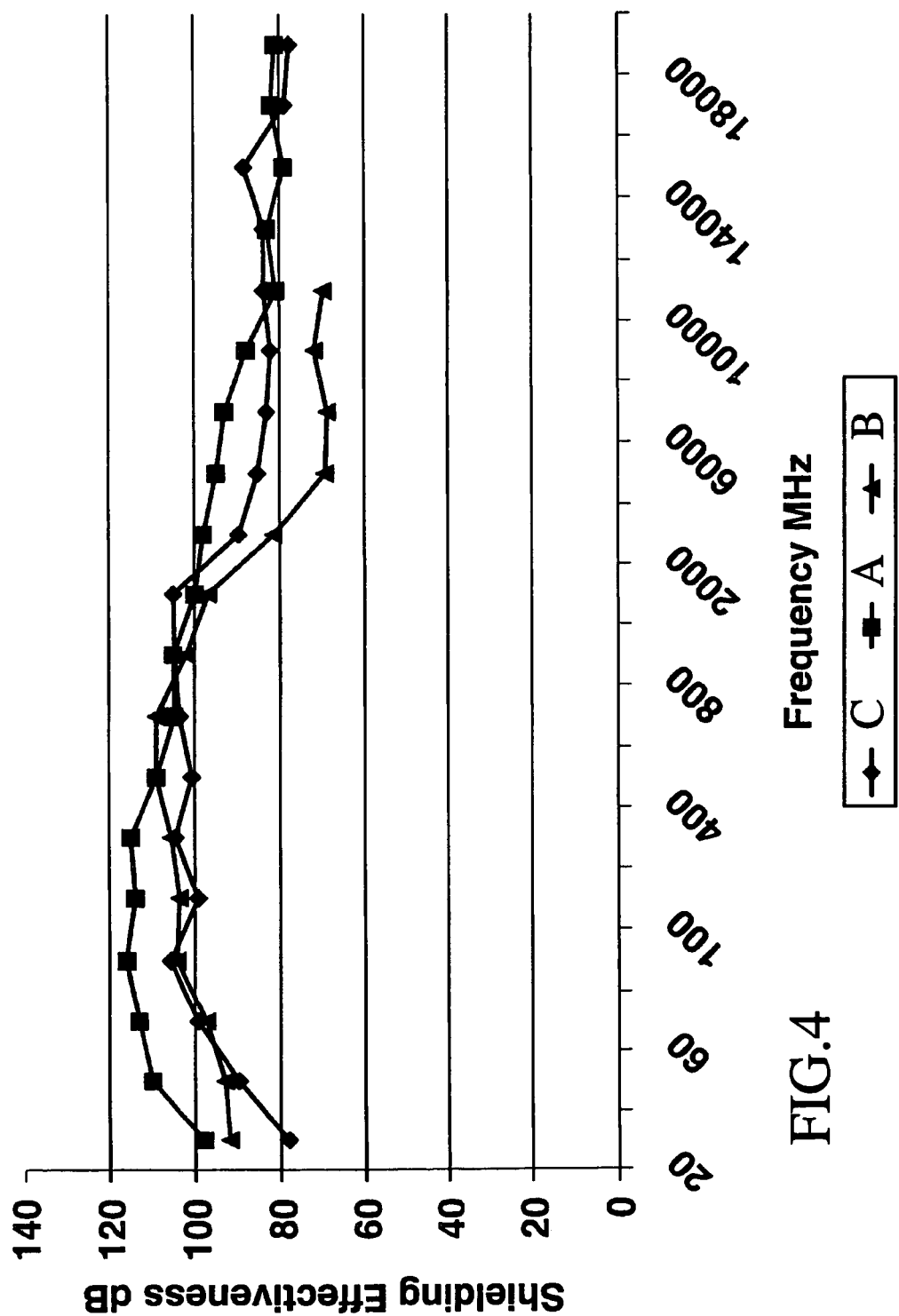
FIG. 4 is a series of graphs showing the shielding effectiveness of a gasket according to the present invention relative to prior art gaskets.

Table I further shows that the shielding effectiveness of the Sample C gasket, on average, is comparable to both conventional gaskets. However, the graph of FIG. 4 illustrates that the Sample C gasket has a more constant shielding effectiveness over the entire test range than either of the conventional gaskets. It is believed that this is because the metal foil presents a non-porous surface, which prevents the passage of high frequencies. A vapor or electroless plated fabric is porous and this porosity is believed to allow high frequencies to pass through.

In FIG. 4, the curves represent normalized values for the shielding effectiveness of a gasket according to the present invention (Sample C) and two commercial gaskets (Samples B and C). According to FIG. 4, the Shielding Effectiveness (as measured in decibels) is tighter in that it varies between 80 and about 105 dB over the frequency range of 20 to 18000 MHz. In contrast sample A has a dB range of 80 to 120 and Sample B ranges between 70 and about 110 dB over the frequency range.

It also should be noted that for the gasket of the present invention (Sample C) the decibels at the low end of the frequency range is about the same as at the high end of the range. In contrast each of the conventional gaskets the decibel level at the highest frequencies is about 20 decibels lower than that at the lowest frequencies.

Accordingly, the EMI gasket of the present invention comprising a foil lamination wrapped about a compressible core has resulted in several unexpected advantages. In this respect the EMI gasket of the present invention has a better surface resistivity, a better surface conductivity and a more constant shielding effectiveness over a range of frequencies than a comparable gasket formed with a fabric metallized by vapor or electroless deposition.

The flexible substrate of the lamination has been fond to allow bending the relatively thick foil without cracking so the lamination can be wrapped about a core material so as to fully enwrap the core. It further allows repeated compression and decompression of the gasket without failing.

The greater thickness of the metal foil gives the EMI gasket a better surface resistivity and the foil surface is relatively flat and not porous so both the contact resistance of the gasket and the shielding effectiveness of the gasket are better than a gasket employing a fabric metallized by vapor or electroless deposition. Manufacturing also is easier in that both the flexible substrate and the foil are provided in relatively long lengths so the lamination of one to the other can occur in a continuous process to provide a long length of a lamination for further processing into an EMI gasket.

Accordingly, the present invention achieves its intended objects in providing an EMI gasket that is easy and less costly to manufacture, has improved contact and surface resistivity properties and has a relatively constant shielding effectiveness over a range of frequencies.

What is claimed is:

1. In a conductive electromagnetic interference (EMI) shielding gasket including a compressible core having a conductive laminate on a least one surface of the core, the improvement comprising the laminate having:
    a) a substrate being one of a woven fabric, a non woven fabric and a polymeric film;
    b) an adhesive layer on a surface of the substrate;
    c) a metal foil at least 0.2 mils thick bonded to the substrate by the adhesive directly contacting a reverse surface of the metal foil; and
    d) a vapor deposited abrasion and corrosion resistant coating on the obverse surface of the metal foil.

2. A conductive EMI shielding gasket as in claim 1 wherein the substrate is a non-porous polymeric film.

3. A conductive EMI shielding gasket as in claim 1 wherein the substrate is a non-woven polyester and the metal foil is aluminum.

4. A conductive EMI shielding gasket as in claim 1 wherein the substrate comprises a polyester film substrate, the metal foil is aluminum and the compressible core is an open cell polyurethane.

5. A conductive EMI shielding gasket as in claim 1 wherein the surface resistivity of the gasket is below 0.004 ohms/square and the average Shielding Effectiveness over a range of frequencies from 20 MHz to 10 GHz is below 97 dB.

6. A conductive EMI shielding gasket as in claim 1 wherein the adhesive is ethyl acrylic acetate.

7. A conductive EMI shielding gasket as in claim 1 wherein the contact resistance is less than 0.11 Ohms-inch at a 1 kg load, the surface resistivity is less than 0.003 ohms/sq and the average Shielding Effectiveness over a range of frequencies from 20 MHz to 10 GHz is below 97 dB.

8. A conductive EMI shielding gasket comprising:
   a) a core composed of an open cell polyurethane foam;
   b) a sheath wrapped around the core, the sheath having a non porous, non woven polyester film substrate, an acrylate adhesive layer on a surface of the substrate, a metal foil at least 0.2 inches thick bonded to the substrate by the adhesive and a vapor deposited abrasion and corrosion resistant coating on the exposed surface of the metal foil; and
   c) the gasket having a surface resistivity of less than 0.003 ohms/sq and an average Shielding Effectiveness over a range of frequencies from 20 MHz to 10 GHz that is below 97 dB.

9. A conductive EMI gasket as in claim 8 wherein the metal foil is aluminum.

10. A method of making a conductive EMI gasket comprising:
   a) forming a sheath by laminating a metal foil at least 0.2 inches thick to a substrate comprising one of a woven fabric, a non woven fabric and a polymeric film, the sheath including a corrosion resistant coating on the exposed surface of the metal foil; and
   b) applying the sheath to at least one surface of a compressible core.

11. A method as in claim 10 wherein the metal foil is one of aluminum and copper.

12. A method as in claim 10 wherein the polymeric film is a polyester.

13. A method as in claim 10 wherein laminating is accomplished by applying an adhesive to one of the substrate and the metal foil and pressing one against the other.

14. A method as in claim 10 wherein the corrosion resistant coating is applied to the surface of the metal foil after laminating the foil to the substrate.

15. A method as in claim 14 comprising applying the corrosion resistant coating by vapor deposition.

16. A method as in claim 10 wherein the substrate is a polymeric film and laminating of the foil to the substrate is accomplished by extruding polymeric film onto the substrate.

* * * * *